United States Patent
Chen et al.

(10) Patent No.: US 7,286,395 B2
(45) Date of Patent: Oct. 23, 2007

(54) CURRENT DRIVEN SWITCHED MAGNETIC STORAGE CELLS HAVING IMPROVED READ AND WRITE MARGINS AND MAGNETIC MEMORIES USING SUCH CELLS

(75) Inventors: Eugene Youjun Chen, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/260,778

(22) Filed: Oct. 27, 2005

(65) Prior Publication Data
US 2007/0097730 A1    May 3, 2007

(51) Int. Cl.
*G11C 11/00* (2006.01)

(52) U.S. Cl. ............. 365/158; 365/173; 365/210; 365/230.03

(58) Field of Classification Search .......... 365/158, 365/173, 210, 200, 230.03
See application file for complete search history.

(56) References Cited

U.S. PATENT DOCUMENTS

| | | | |
|---|---|---|---|
| 6,055,178 A | 4/2000 | Naji | |
| 6,456,525 B1 * | 9/2002 | Perner et al. | 365/171 |
| 6,856,537 B2 * | 2/2005 | Tanizaki et al. | 365/158 |
| 6,862,235 B2 * | 3/2005 | Sakata et al. | 365/202 |
| 6,943,420 B2 * | 9/2005 | Jeong | 257/422 |
| 6,995,999 B2 * | 2/2006 | Morimoto | 365/149 |
| 7,016,222 B2 * | 3/2006 | Morikawa | 365/158 |
| 7,057,921 B2 * | 6/2006 | Valet | 365/158 |
| 7,057,922 B2 * | 6/2006 | Fukumoto | 365/158 |
| 7,190,612 B2 * | 3/2007 | Qian et al. | 365/158 |
| 2006/0120147 A1 * | 6/2006 | Peng et al. | 365/158 |

OTHER PUBLICATIONS

Eugene Chen and Yiming Huai, *Current Driven Switching of Magnetic Storage Cells Utilizing Spin Transfer and Magnetic Memories Using Such Cells*, U.S. Appl. No. 11/217,524.

* cited by examiner

*Primary Examiner*—Hoai V. Ho
(74) *Attorney, Agent, or Firm*—Strategic Patent Group, P.C.

(57) ABSTRACT

A method and system for providing a magnetic memory is described. The magnetic memory includes a plurality of magnetic storage cell and at least one bit line and a plurality of source lines corresponding to the plurality of magnetic storage cells. Each magnetic storage cell includes a magnetic element that is programmed to a high resistance state by a first write current driven through the magnetic element in a first direction and to a low resistance state by a second write current driven through the magnetic element in a second direction. The bit line(s) and the source lines are configured to drive the first write current through the magnetic element in the first direction, to drive the second write current through the magnetic element in the second direction, and to drive at least one read current through the magnetic element in a third direction that does not destabilize the low resistance state.

40 Claims, 9 Drawing Sheets

CURRENT DRIVEN SWITCHED MAGNETIC STORAGE CELLS HAVING IMPROVED READ AND WRITE MARGINS AND MAGNETIC MEMORIES USING SUCH CELLS

FIELD OF THE INVENTION

The present invention relates to magnetic memory systems, and more particularly to a method and system for providing a memory, magnetic storage cells and/or read and/or write schemes having an improved read and write margins.

BACKGROUND OF THE INVENTION

FIG. 1 depicts a small portion of a conventional magnetic random access memory (MRAM) 1. The conventional MRAM 1 includes a magnetic storage cell 10 having a conventional magnetic element 12 that is typically a conventional magnetic tunneling junction (MTJ) 12, and a conventional selection device 14. Also depicted are a write word line 16, a read word line 18, and a bit line 20. Data is stored in the conventional magnetic element 12 by programming the conventional magnetic element to be in a high resistance state or a low resistance state. This programming is typically performed by applying magnetic fields from current pulses flowing in both the bit line 20 and the write word line 16. In general, the magnetic field generated by current flowing in either the bit line 20 or the write word line 16 alone is insufficient to program the conventional magnetic element 12. The conventional magnetic element 12 is read by activating the selection device 14 using the read word line 18 and driving a read current through the conventional magnetic element.

FIG. 2 depicts a larger portion of a conventional MRAM array 30 which uses multiple conventional memory cells, such as the conventional memory cell 10 depicted in FIG. 1. Referring back to FIG. 2, the conventional magnetic storage cells 10 are arranged in rows and columns. The conventional magnetic storage cells 10 are still associated with read word lines 18, write word lines 16, and bit lines 20. Also depicted are bit line selector 32, word line selector 34, first digit line selector 36, second digit line selector 38, bit and ground line selector 40, differential current sensor with current sources 42, comparator 44, reference column 46 having storage cells 10' corresponding to the storage cells 10 and bit line 22 corresponding to the bit lines 20, and switches 48, 50, 52, 54, 56, and 58. The read word lines 18 are connected to and enabled by the word line selector 34. Each write word line 16, which may also be termed a digit line, is connected to first and second digit line selectors 36 and 38, respectively. Read word lines 18, and write word lines 16 run horizontally, while bit lines 20, which also serve as data lines, run vertically. The bit lines 20 are connected to first and second bit line selectors 32 and 40. The switches 48, 50, 52, 54, 56, and 58, at the ends of the lines 16, 18, 20, and 22 are typically transistors and connect the lines 16, 18, 20, and 22 to voltage sources, such as the power supply or ground.

During a write operation, a bit line 20 is activated and carries a current that generates a portion of the magnetic field required for switching (termed the switching field) the magnetic element 12. In addition, a corresponding write word line 16 is activated and carries a current that generates a remaining portion of the switching field. In most conventional MRAM 30, neither the magnetic field generated using the bit line 20, nor the magnetic field generated by the write word line 16 is alone sufficient to program, or switch the state of, any conventional magnetic element 12. However, in combination the bit line 20 and the write word line 16 can generate the switching field at their cross point. Consequently, a selected conventional magnetic element 12 can be written.

During a read operation, a read word line 18 and a corresponding bit line 20 containing the magnetic element to be read are activated. Only the conventional magnetic storage cell 10 at the cross point between the activated bit line 20 and the activated read word line 18 has current driven through it and, therefore, read. The resistance state of the conventional magnetic storage cell being read is compared to the reference cell 10' using the differential current sensor 42 and the comparator 44, which compares the two current signals and produces an output $V_{out}$ for memory state "1" or "0".

Although the conventional MRAM 30 functions, one of ordinary skill in the art will readily recognize that there are drawbacks. Programming uses magnetic fields due to current driven through the corresponding lines 16 and 20. The magnetic fields are not a localized phenomenon. In addition, a relatively large current corresponding to a relatively large magnetic field is used to program the conventional magnetic storage cells 10. Consequently, the nearby cells may be disturbed or inadvertently written. As a result, performance of the conventional MRAM 10 suffers. This problem may be solved by using an advanced architecture called toggle writing. However, toggle writing requires much higher magnetic field, which utilizes a significantly higher current. Furthermore, for the conventional magnetic element 12 written using an applied field, the current required to generate the switching field increases as the width of the conventional magnetic element 12 decreased. Consequently, power consumption is greatly increased, particularly for a smaller magnetic element 12 in a higher density memory. This increased power consumption is undesirable. Moreover, toggle writing requires a read verification prior to actual writing. A total access time is, therefore, larger. This greater access time also makes toggle writing unattractive for high speed applications. In addition, the current generation memory cell size for conventional MRAM including toggle writing MRAM is close to $40f^2$ with f being the lithographic critical dimension. This size range is competitive with semiconductor memory SRAM in density. However, MRAM may cost more because MRAM uses five to seven more masks during fabrication than SRAM. Consequently, another mechanism for providing an MRAM is desired.

FIG. 3 depicts a small portion of a conventional spin transfer based switching random access memory (spin RAM) 70. The spin RAM 70 includes a conventional magnetic storage cell 80 including a conventional magnetic element 82 and a selection device 84, word line 86, bit line 88, and source line 90. The word line 86 is oriented perpendicular to the bit line 88. The source line 90 is typically either parallel or perpendicular to the bit line 88, depending on specific architecture used for the spin RAM 70.

The conventional magnetic element 82 is configured to be changeable between high and low resistance states by driving a spin polarized current through the conventional magnetic element 82. The spin polarized current changes state of the conventional magnetic element 82 using spin transfer effect. For example, the conventional magnetic element 82 may be a MTJ configured to be written using spin transfer. Typically, this is achieved by ensuring that the MTJ 82 has a sufficiently small cross-sectional area and that the layers of the MTJ have particular thicknesses. When the current density is sufficient, the current carriers driven through the conventional magnetic element 82 may impart sufficient torque to change the state of the conventional magnetic element 82. When a write current is driven in one direction, the state may be changed from a low resistance state to a high resistance state. When the write current is driven in the opposite direction, the state may be changed from a high resistance state to a low resistance state.

In order to program the conventional storage cell 80, the bit line 88 and the word line 86 are activated. A current is driven between the source line 90 and the bit line 88. If current is driven in one direction, for example from the source line 90 to the bit line 88, then the conventional magnetic element 82 is programmed to one of the two states. If current is driven in the opposite direction, for example from the bit line 88 to the source line 90, then the conventional magnetic element is programmed to the other of the two states.

For a read operation, the bit line 88 and the word line 86 are activated. Consequently, the selection device 84 is turned on. A read current is driven through the conventional magnetic element 82. The read current may be provided by a differential current sensor analogous to the differential current sensor 42 depicted in FIG. 2. Referring back to FIG. 3, the read current is thus provided to the bit line 88, which may have its bias voltage clamped. As a result, a high magnetoresistive signal can be obtained during sensing. In some conventional spin RAM, a reference cell (not shown in FIG. 3) may be used. In such a conventional spin RAM, a portion of the read current is provided to the conventional magnetic storage cell 80 being read and a portion of the current is provided to the reference cell. Thus, the current being sensed during a read operation is the difference between a constant supply current and the current that actually flows through the MTJ element. A comparator that is analogous to the comparator 44 of FIG. 2, compares the output of the differential current sensor to determine the state of the conventional magnetic storage cell 80. Thus, the conventional magnetic storage cell 80 can be programmed and read.

Thus, the conventional spin RAM 70 utilizes a write current driven through the magnetic element 82 in order to program data to the conventional magnetic storage cell 80. Thus, the conventional spin RAM 70 uses a more localized phenomenon in programming the conventional magnetic element 82. Thus, unlike the conventional MRAM 1/30, the conventional spin RAM 70 does not suffer from a half select write disturb problem.

Furthermore, for smaller magnetic elements 82 and, therefore, higher memory densities, the conventional spin RAM 70 uses a lower current. FIG. 4 is a graph 92 depicting a comparison between the write current for the conventional magnetic field switched MRAM 30 and for the conventional spin RAM 70. Note that the write current for toggle writing MRAM is higher than the current in FIG. 4. As can be seen from FIG. 4, for a conventional magnetic element 12/82 having width larger than two hundred nanometers, the current required for the conventional spin RAM 70 is higher than that for conventional MRAM 30. For conventional magnetic element 12/82 having a width less than two hundred nanometers, the write current for the conventional spin RAM 70 is less than for the conventional MRAM 30. Furthermore, for the conventional spin RAM 70, the write current decreases with decreasing width. Thus the spin RAM 70 possesses the desired scaling trend.

Although the conventional spin RAM 70 utilizes a lower current and a more localized programming scheme, the conventional spin RAM 70 may suffer from read disturb issues. FIG. 5 is a graph 94 depicting conventional spin RAM 70 write and read current distributions. The distribution 95 is a write current distribution having a minimum current I1. The distribution 96 is a reading current distribution used for the low resistance state of the conventional magnetic element 82 and having a maximum current I2. The distribution 97 is a read current distribution used for the high resistance state of the conventional magnetic element 82 and having a maximum current I3. The difference between the maximum reading current, in the distribution 96, and the minimum write current, in the distribution 95, represents the read and write margin. Stated differently, after many read cycles, it may be possible for a read current, such as the current I2, to inadvertently write to the conventional magnetic element 82 even though I2 is lower than I1. Thus, as can be seen by the distributions 95 and 96, for a read current appropriate for the low resistance state, read and write margin may be small.

Large differences for the read currents for the low and high resistance states, in the distributions 96 and 97, are desirable for high speed memory operations. Stated differently, the distribution 96 is desired to be at a significantly larger current than the distribution 97. For example, the distribution 96 may be desired to be centered at one hundred twenty microamperes, while the distribution 97 may be desired to be at approximately sixty microamperes. Furthermore, in order to reduce the size of the selection device 84 and thus the size of the conventional magnetic storage cell 80, the write current is desired to be as small as possible. For example, the distribution 95 may be desired to be centered around two hundred microamperes. Consequently, the difference between writing and reading currents, or the read and write margin, is reduced for a high density memory having a small cell size, particularly for a high speed and large read signal. Because the read and write margins may be small, the read current used may destabilize the state of the magnetic element 82. The read currents used in the distributions 96 or 97 may inadvertently, therefore, write to the conventional spin RAM 70.

Furthermore, a conventional spin RAM memory module, such as would include the conventional spin RAM 70, includes millions to thousands of millions of magnetic elements 82. Process variations may cause the writing and reading currents of the magnetic elements 82 within a conventional spin RAM 70 to have a distribution range. Consequently, the distributions 95, 96, and 97 are depicted as having a width. Stated differently, there may be magnetic elements with write currents between I1 and I2. Similarly, there are magnetic elements having their desired read currents between I1 and I2, between I2 and I3, or below I3. These are called tail distribution bits, or outliers. In addition to process variation caused distribution, thermal effects may also cause variations in read and/or write currents. The magnetic switching process is fundamentally a thermally assisted process, regardless whether the magnetic element 82 is switched by a magnetic field or by a spin polarized electrical current through the spin torque transfer effect. Because of the large number of magnetic memory elements 82 used in a single device chip, and the large number of operating cycles for the whole period of the device product life, thermal assisting can cause the switching writing current for a magnetic element to be much lower than its typical value during a particular cycle. The read current is desired to be even lower than this occasional low writing current.

Consequently, the write and read margins may be even smaller. Thus, the possibility of data being compromised during a read operation might be even further increased.

Accordingly, what is desired is a method and system for providing and utilizing memory cells employing spin transfer based switching with improved read and write margin, or reduced reading current induced accidental writing error. The present invention addresses such a need.

BRIEF SUMMARY OF THE INVENTION

The present invention provides a method and system for providing a magnetic memory. The magnetic memory comprises a plurality of magnetic storage cell and at least one bit line and a plurality of source lines corresponding to the plurality of magnetic storage cells. Each magnetic storage cell includes a magnetic element that is programmed to a high resistance state by a first write current driven through the magnetic element in a first direction and to a low resistance state by a second write current driven through the magnetic element in a second direction. The bit line(s) and the source lines are configured to drive the first write current through the magnetic element in the first direction, to drive the second write current through the magnetic element in the second direction, and to drive at least one read current through the magnetic element in a third direction that does not destabilize the low resistance state.

According to the method and system disclosed herein, the present invention provides a mechanism for programming and reading a magnetic memory that provides a higher read and write margin.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic memory. The magnetic memory comprises a plurality of magnetic storage cell and at least one bit line and a plurality of source lines corresponding to the plurality of magnetic storage cells. Each magnetic storage cell includes a magnetic element that is programmed to a high resistance state by a first write current driven through the magnetic element in a first direction and to a low resistance state by a second write current driven through the magnetic element in a second direction. The bit line(s) and the source lines are configured to drive the first write current through the magnetic element in the first direction, to drive the second write current through the magnetic element in the second direction, and to drive at least one read current through the magnetic element in a third direction that does not destabilize the low resistance state.

The present invention is described in the context of particular magnetic memories having certain components, such magnetic storage cells having magnetic elements including particular components and particular isolation devices. One of ordinary skill in the art will readily recognize that the present invention is consistent with the use of magnetic memories having other and/or additional components. Furthermore, the present invention is described in the context of components corresponding to certain portions of the memory. The method and system in accordance with the present invention are also described in the context of reading from or writing to a single magnetic storage cell. However, one of ordinary skill in the art will readily recognize that the method and system can be extended to read from and/or write to multiple magnetic storage cells substantially in parallel. Finally, the present invention is described in the context of certain memories. However, one of ordinary skill in the art will readily recognize that the present invention is compatible with memories and other devices not inconsistent with the present invention.

Figure 6:
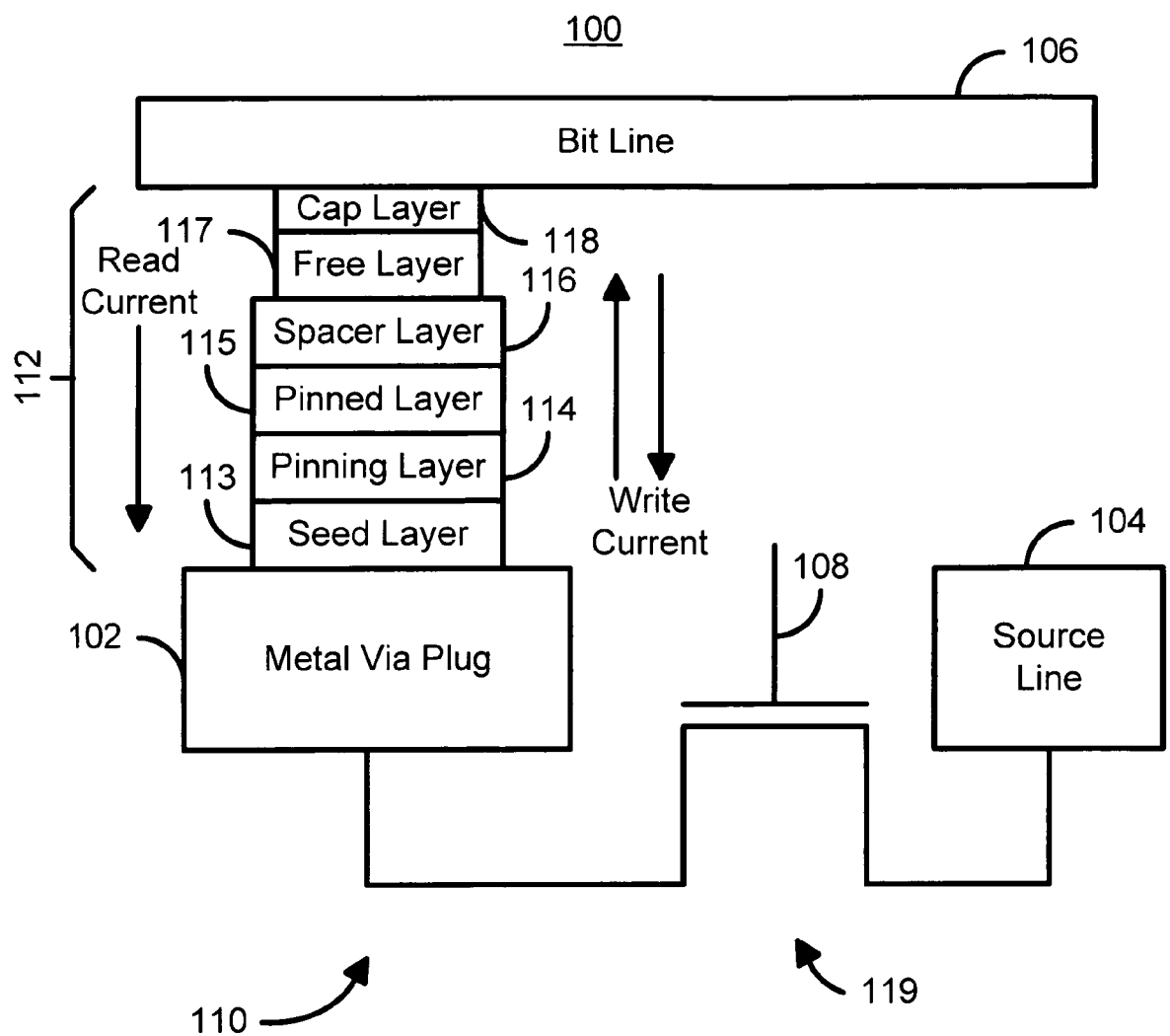
FIG. 6 is a diagram of a portion of one embodiment of a magnetic memory in accordance with the present invention utilizing a single spacer magnetic element.

To more particularly describe the method and system in accordance with the present invention, refer to FIG. 6, depicting of a portion of one embodiment of a magnetic memory 100 in accordance with the present invention utilizing a single spacer magnetic element. The magnetic memory 100 is a spin RAM. The magnetic memory 100 includes a magnetic storage cell 110 as well as a metal via plug 102 (which might be considered part of the magnetic storage cell 110), source line 104, bit line 106, and word line 108. The magnetic storage cell 110 includes a magnetic element 112 configured to be written using spin transfer and, preferably, a selection device 119. The selection device 119 is preferably a transistor. The magnetic element 112 shown includes at least a pinned layer 115, a spacer layer 116, and a free layer 117. The pinned layer 115 and free layer 117 are magnetic. Although depicted as simple layers, one or both of the pinned layer 115 and the free layer 117 may be a multilayer such as a synthetic antiferromagnet (SAF) including two ferromagnetic layers separated by a nonmagnetic, conductive spacer layer such as Ru. The spacer layer 116 resides between the pinned layer 115 and the free layer 117. The spacer layer 116 may be conducting or insulating. In a preferred embodiment, the spacer layer 116 is a tunneling barrier layer. In a preferred embodiment, the magnetic element 112 also includes a pinning layer 114 that is preferably an antiferromagnetic (AFM) layer. However, in another embodiment, other mechanisms may be used to pin the magnetization of the pinned layer 115. The magnetic element 112 may also include seed and capping layers 113 and 118, respectively. However, in another embodiment, the magnetic element 112 may include different and/or additional components consistent with the present invention.

The magnetic element 112 is programmed using the spin transfer effect by passing a current through the magnetic element 112. In particular, the magnetic element 112 may be programmed by a current driven between the bit line 106 and the source line 104. The magnetic element 112 is configured such that the magnetic element 112 is programmed to a low resistance state by a write current passed from the free layer 117, through the spacer layer 116, to the pinned layer 115. The magnetic element 112 is also configured such that the magnetic element 112 is placed in a high resistance state by a write current passed from the pinned layer 115, through the spacer layer 116, to the free layer 117. Stated differently, the magnetic element 112 is programmed to a high resistance state by driving a current from the source line 104 to the bit line 106. Similarly, the magnetic element 112 is programmed to a low resistance state by driving a read current from the bit line 106 to the source line 104.

The magnetic memory 100, particularly the bit line 106, the source line 104, and the magnetic storage cell 110 are configured such that the read current(s) used are driven in a direction that does destabilize, and preferably reinforces, the low resistance state. In the embodiment 100 shown, the read current(s) would be driven from the bit line 106 to the source line 104. In a preferred embodiment, the magnetic element 112 is read by clamping the bit line at a constant voltage, VBL, while the source line is set at a lower voltage, VSL, such as ground voltage. The voltage difference between VBL and VSL is distributed between the magnetic element 112 and the selection device 119. A voltage at the metal via plug 102 is given by $V_{plug}$. VBL preferably is chosen such that the bias voltage ($V_{read}$) on the magnetic element, VBL-$V_{plug}$, is in the range for which the magnetic element 112 has the highest signal output. In one embodiment, this range is one hundred millivolts to five hundred millivolts.

Figure 1:
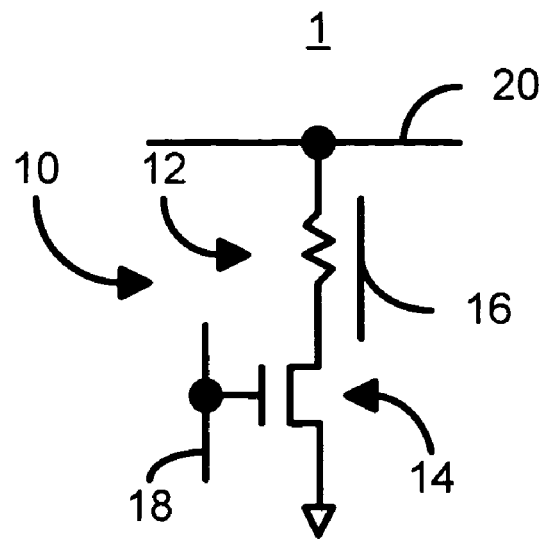
FIG. 1 is a diagram of a portion of a portion conventional magnetic random access memory.
Figure 3:
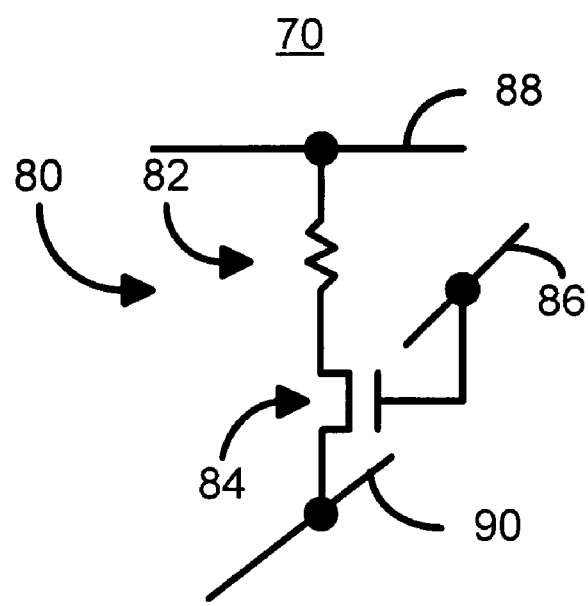
FIG. 3 is a diagram of a magnetic storage cell utilizing spin transfer in switching.
Figure 2:
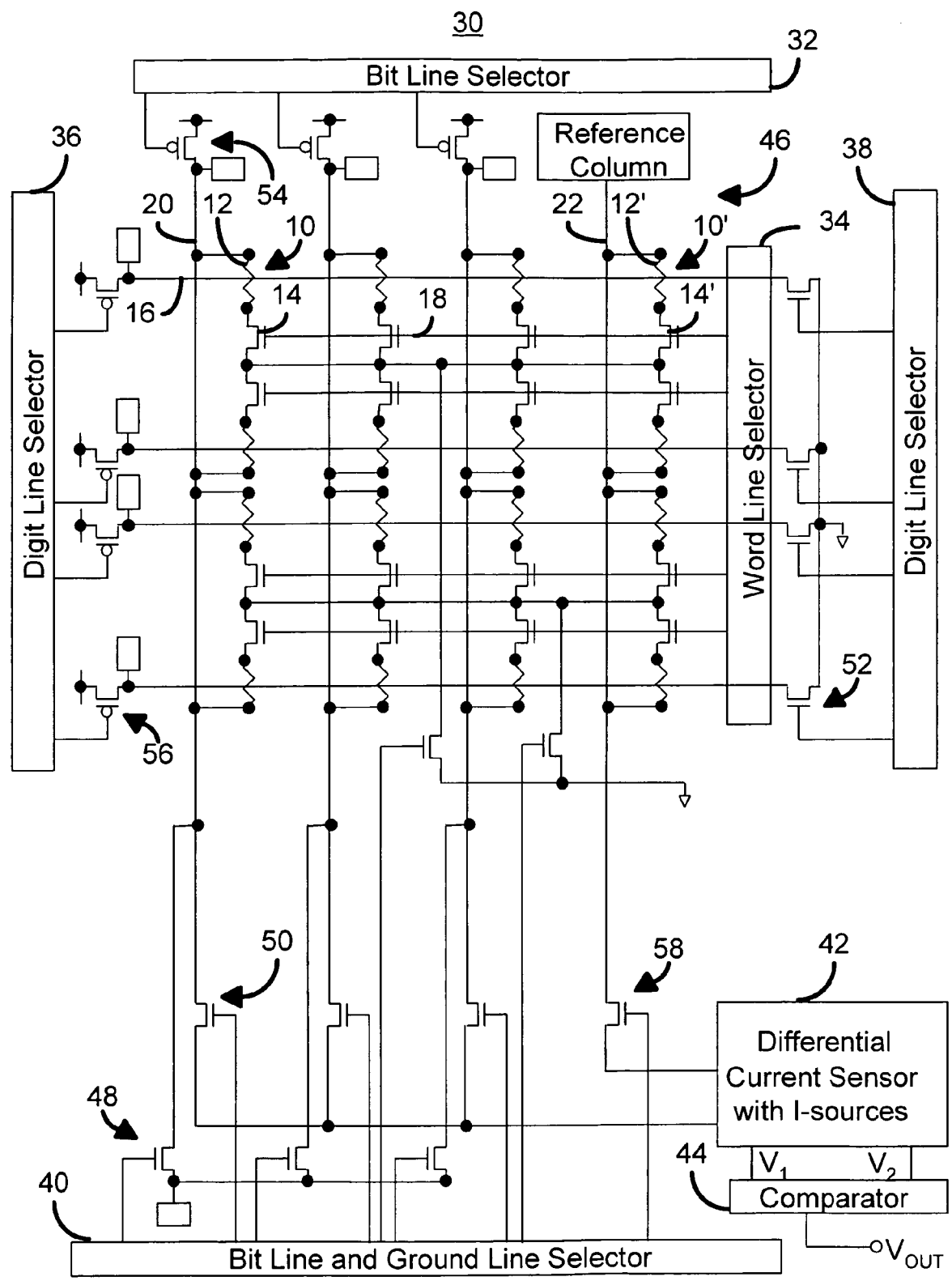
FIG. 2 is a diagram of a portion of a conventional magnetic random access memory.
Figure 4:
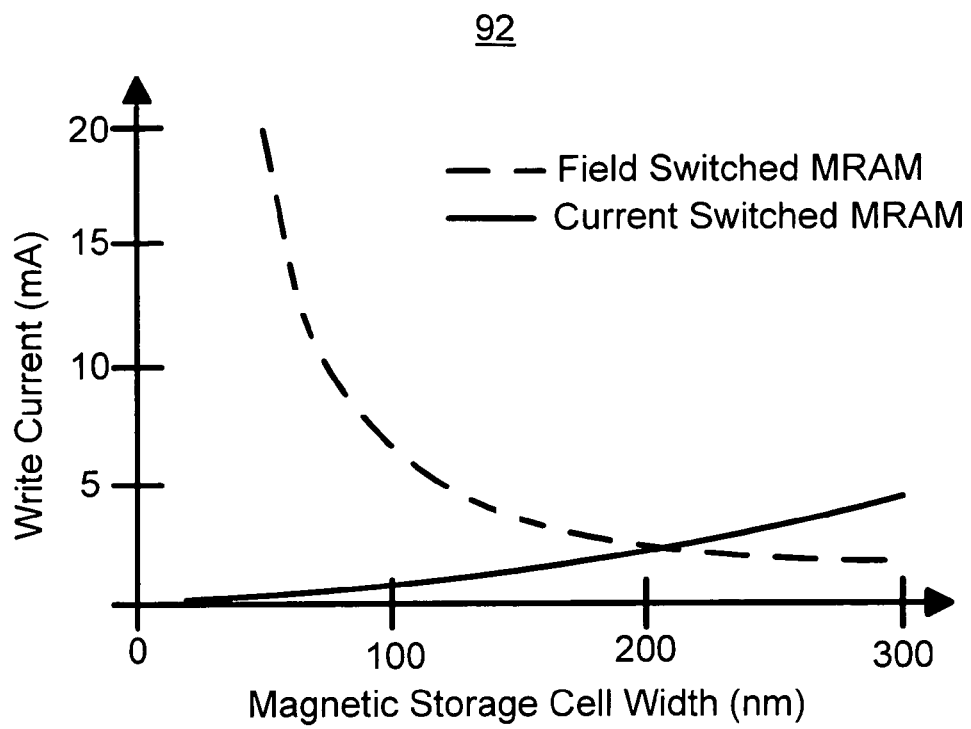
FIG. 4 is a graph depicting a comparison between the write current for the conventional magnetic field switched MRAM and for the conventional spin RAM.
Figure 5:
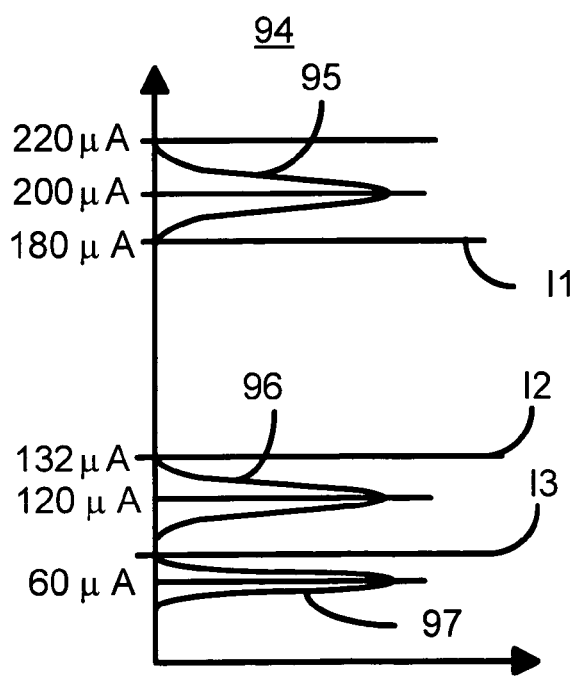
FIG. 5 is a graph depicting conventional spin RAM write and read current distributions.

Referring to FIGS. 5 and 6, when Vread is applied to the embodiment of the magnetic memory 100, the current flowing through the magnetic element is in the distribution 96 if the magnetic element 112 is in its low resistance state and in the distribution 97 if the magnetic element is in its high resistance state. In a preferred embodiment, I2 is significantly higher than I3 because the maximum resistance for the high resistance state is significantly greater than the minimum resistance for the low resistance state. Because at least the read current I2 is driven from the bit line 106 to the source line 104, the read current I2 does not destabilize the low resistance state of the magnetic element 112. Preferably, the spin torque produced by the reading current I2 reinforces the minimum resistance state. Stated differently, the read current I2 would not tend to inadvertently write to the magnetic element 112. Only the much lower reading current I3, which is preferably driven in the same direction as the current I2, produces a spin torque which tend to destabilize the maximum resistance state. Stated differently, the read current I3 does produce a spin torque that could inadvertently write to the magnetic element 112. Thus, the difference between the write current of the distribution 95 and the read current of the distribution of the read current 97 becomes the read and write margin. This larger difference is the read and write margin instead of the difference between the writing current 95 and the higher reading current of the distribution 96 being the read and write margin. Thus the margin between the writing and reading current is increased for the magnetic memory 100.

Thus, the magnetic memory 100 has a higher read and write margin. Consequently, the magnetic memory 100 is less likely to be inadvertently written during reading.

Figure 7:
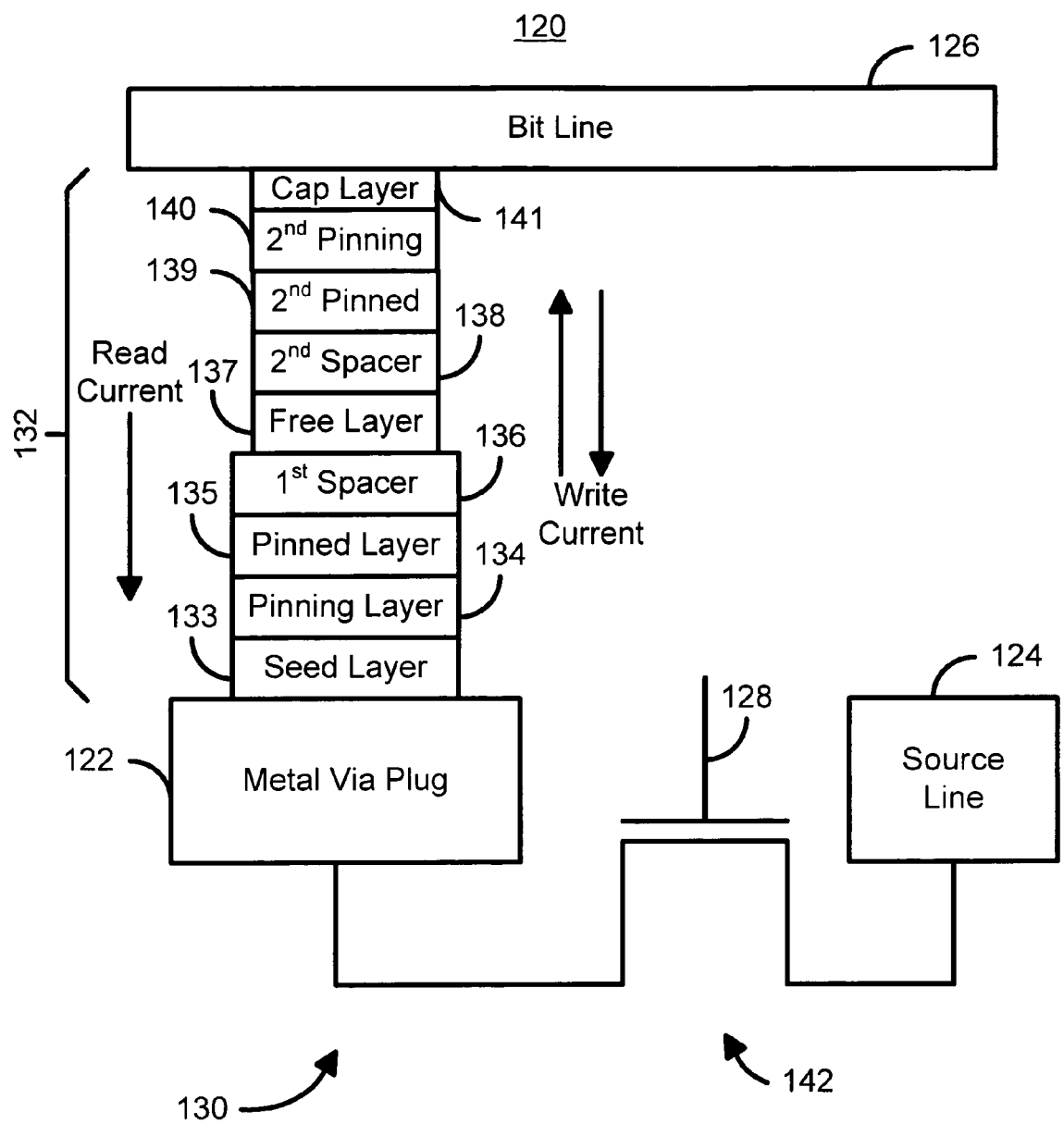
FIG. 7 is a diagram of a portion of another embodiment of a magnetic memory in accordance with the present invention utilizing a magnetic element with a barrier and a spacer in accordance with the present invention.

FIG. 7 is a diagram of a portion of another embodiment of a magnetic memory 120 in accordance with the present invention utilizing a magnetic element with a barrier and a spacer in accordance with the present invention. The magnetic memory 120 is a spin RAM. The magnetic memory 120 includes a magnetic storage cell 130 as well as a metal via plug 122 (which might be considered part of the magnetic storage cell 130), source line 124, bit line 126, and word line 128. The magnetic storage cell 130 includes a magnetic element 132 configured to be written using spin transfer and, preferably, a selection device 142. The selection device 142 is preferably a transistor. The magnetic element 132 shown includes at least a first pinned layer 135, a first spacer layer 136 that is preferably a tunneling barrier layer 136, a free layer 137, a second spacer layer 138, and a second pinned layer 139. The pinned layers 135 and 139 and free layer 137 are magnetic. Although depicted as simple layers, one or both of the pinned layers 135 and 139 and the free layer 137 may be a multilayer such as a synthetic antiferromagnet (SAF) including two ferromagnetic layers separated by a nonmagnetic, conductive spacer layer such as Ru. The second spacer layer 138 may be conductive or another insulating tunneling barrier layer. The second spacer layer 138 may have a lower resistance than the spacer layer 136. Thus, in one embodiment, the second spacer layer 138 is a tunneling barrier layer with a lower tunneling resistance than the tunneling barrier layer 136. Thus, the barrier layer 136 is the dominant tunnel barrier. The pinned layers 135 and 139 configured such that their magnetizations in the regions closer to the free layer 137 are antiparallel. The magnetic element 132 may also include pinning layers 134 and 140 that are preferably AFM layers. However, in another embodiment, other mechanisms may be used to pin the magnetizations of the pinned layers 135 and 139. The magnetic element 132 may also include seed and capping layers 133 and 141, respectively.

The magnetic element 132 is programmed using the spin transfer effect by passing a current through the magnetic element 132. To program the magnetic element 132 into a low resistance state, a write current is preferably passed from the free layer 137, through the dominant barrier layer 136, to the pinned layer 135. To program the magnetic element into a high resistance state, a write current is passed from the pinned layer 135, through the dominant barrier layer 136, to the free layer 137. Thus, in a write operation, the word line 128 activates the selection device 142 and the write current is driven in the desired direction.

The magnetic memory 120, particularly the bit line 126, the source line 124, and the magnetic storage cell 130 are configured such that the read current(s) used are driven in a direction that does not destabilize, and preferably reinforces, the low resistance state. In the embodiment 120 shown, the read current(s) would be driven from the bit line 126 to the source line 124. In operation, the bit line 126 may be clamped at a constant voltage while the source line 124 may be set at a lower voltage, such as ground voltage. The voltage difference between VBL and VSL is distributed between the magnetic element 132 and the transistor 142. VBL is preferably chosen such that the bias voltage (Vread) on the magnetic element (VBL-$V_{plug}$) is in a range such that magnetic element 120 has the largest signal output. This range is preferably on the order of one hundred to five hundred millivolts.

Referring to FIGS. 5 and 7, in a preferred embodiment, I2 is significantly higher than I3 because the maximum resistance for the high resistance state is significantly greater than the minimum resistance for the low resistance state. Because at least the read current I2 is driven from the bit line 126 to the source line 124, the read current I2 does not destabilize the low resistance state of the magnetic element 132. Preferably, the spin torque produced by the reading current I2 reinforces the minimum resistance state. Stated differently, the read current I2 would not tend to inadvertently write to the magnetic element 132. Only the much lower reading current I3, which is preferably driven in the same direction as the current I2, produces a spin torque which tend to destabilize the maximum resistance state. Stated differently, the read current I3 does produce a spin torque that could inadvertently write to the magnetic element 132. Thus, the difference between the write current of the distribution 95 and the read current of the distribution of the read current 97 becomes the read and write margin. This larger difference is the read and write margin instead of the difference between the writing current 95 and the higher reading current of the distribution 96 being the read and write margin. Thus the margin between the writing and reading current is increased for the magnetic memory 120. As a result, the magnetic memory 120 is less likely to be inadvertently written during reading.

Figure 8:
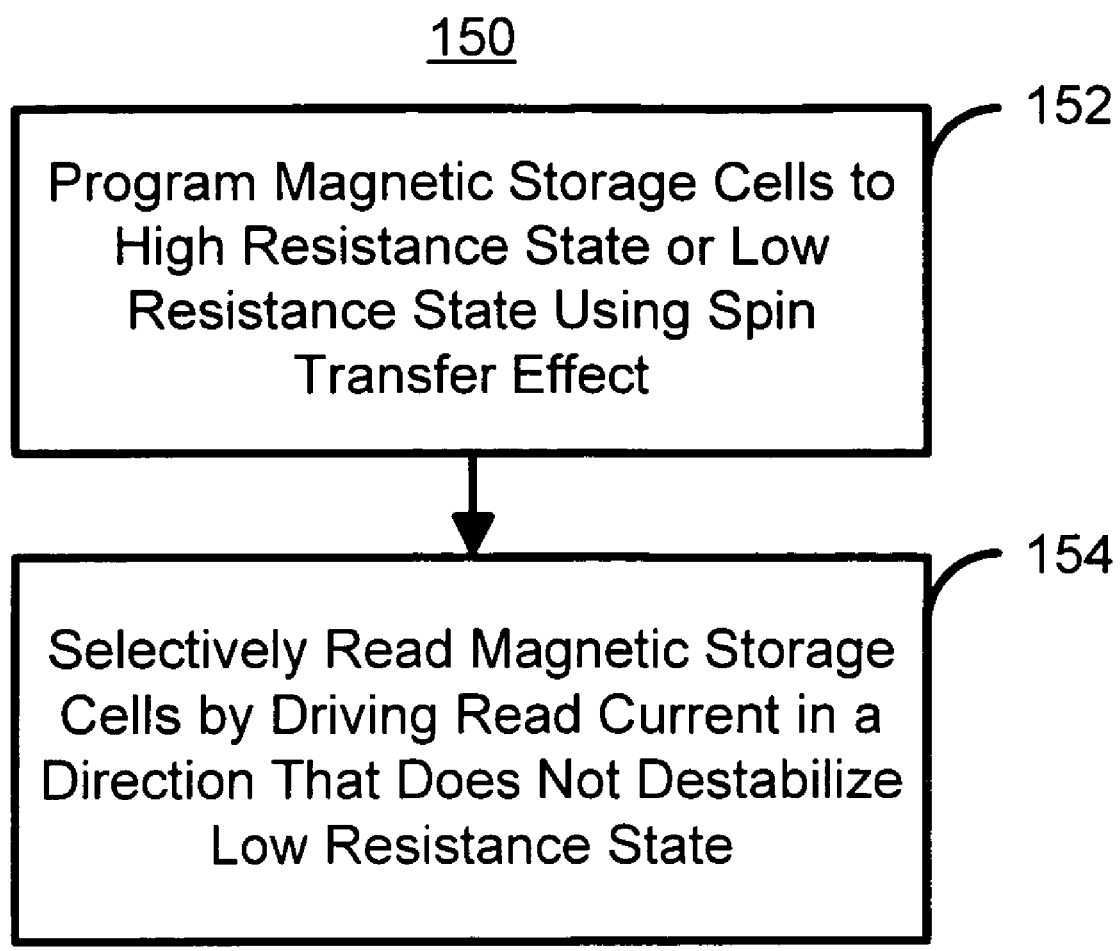
FIG. 8 is a flow chart depicting one embodiment of a method in accordance with the present invention for utilizing a magnetic memory to provide an improved read and write margin.

FIG. 8 is a flow chart depicting one embodiment of a method 150 in accordance with the present invention for utilizing a magnetic memory to provide an improved read and write margin. The method 150 is preferably used with the magnetic memories 100, 120, and/or 160 and 200 (depicted below). Consequently, the method 150 is described in the context of the magnetic memory 100. The selected memory cell(s) 110 are programmed to a high resistance state or a low resistance state, via step 152. The programming includes programming the high resistance state by driving the write current through the magnetic element 112 in a first direction or programming the low resistance state by driving a second write current driven through the magnetic element 112 in a second direction. The second direction is generally opposite to the first direction.

The magnetic memory 100 is selectively read via step 154. Reading the magnetic memory in step 154 includes driving read current(s) through the magnetic element 112 in a direction that does not destabilize the low resistance state. This direction is preferably the same as the second direction.

Thus, using the method 150, the magnetic memory 120 or 100 may be programmed and read. Furthermore, the magnetic memory 100 has a higher read and write margin. Consequently, the magnetic memory 100 is less likely to be inadvertently written during reading.

Figure 9:
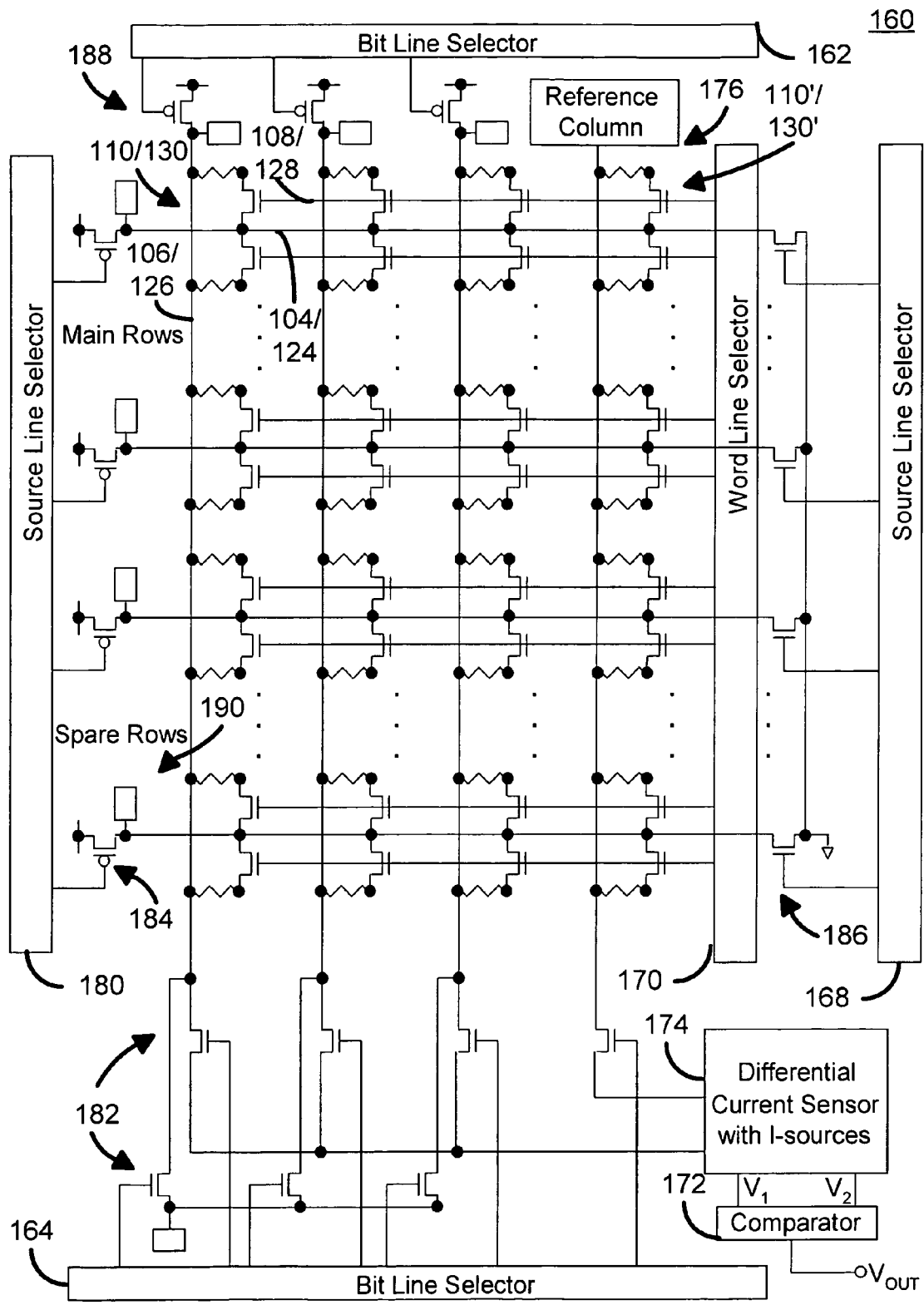
FIG. 9 is a diagram of a portion of one embodiment of an MRAM in accordance with the present invention including spare row(s).

FIG. 9 is a diagram of a portion of one embodiment of an MRAM 160 in accordance with the present invention including spare row(s). The magnetic elements used in FIG. 9 may be the magnetic elements 112, 132, or other magnetic elements (not shown) programmable using spin transfer and may be operated using the method 150. The portion of the MRAM 160 depicted in FIG. 9 is preferably one input/output (or I/O) block. A memory typically includes more I/O blocks and preferably includes at least eight blocks. The MRAM 160 includes bit line selectors 162 and 164, source line selectors 180 and 168, word line selector 170, comparator 172, differential current sensor with current sources 174, reference column 176 having cells 110'/130' analogous to the cells 110 and 130, and switches 182, 184, 186, and 188 that are preferably transistors. The magnetic storage cells 110/130 and 110'/130' are programmed and written as described above for the magnetic memories 100 and 120.

In addition to having memory rows actually used and planned to be used in data storage as described above, other rows may also be provided. For example, in one embodiment, the MRAM 160 includes five hundred twelve rows, or one thousand twenty four rows, or another large number, that are planned. The MRAM 160 also includes in this memory block spare row(s) such as row(s) 190. The spare row(s) include the same components, such as the magnetic storage cells 110/130 including magnetic elements 112/132. In addition, the magnetic memory 160 is configured to be written and read in a manner that is analogous to the magnetic memories 100 and 120.

The spare row(s) 190 are used to account for malfunctions of cells in the remaining rows of the magnetic memory 160. During wafer level memory die testing, the magnetic memory 160 may be tested. For example, varying writing pulse magnitudes in conjunction with a reading operation may be used to determine the magnetic storage cells 110/130 that get written below a pre-determined minimum write current level, and cells 110/130 that do not write even with a pre-determined maximum writing current level. These storage cells are considered writing outliers. The rows that contain these outlier bits can then be substituted with good spare rows 190 by activating latch switches in word line and source line selectors. In this manner, the wafer yield can be enhanced.

Figure 10:
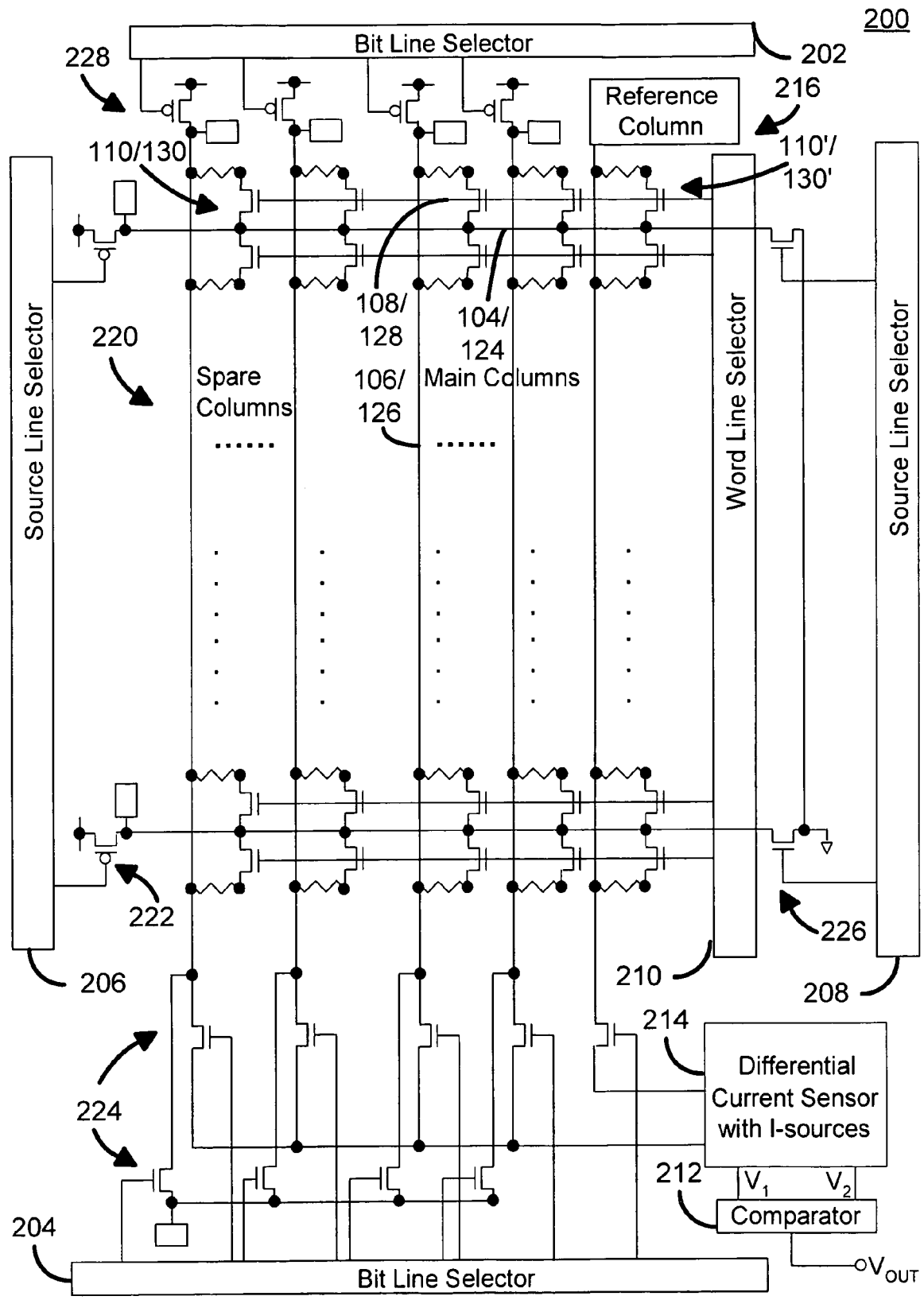
FIG. 10 is a diagram of a portion of another embodiment of an MRAM in accordance with the present invention including spare column(s).

FIG. 10 is a diagram of a portion of another embodiment of an MRAM 200 in accordance with the present invention including spare column(s). The magnetic elements used in FIG. 10 may be the magnetic elements 112, 132, or other magnetic elements (not shown) programmable using spin transfer and may be operated using the method 150. The portion of the MRAM 200 depicted in FIG. 10 is preferably one input/output (or I/O) block. A memory typically includes more I/O blocks and preferably includes at least eight blocks. The MRAM 200 includes bit line selectors 202 and 204, source line selectors 206 and 208, word line selector 210, comparator 212, differential current sensor with current sources 214, reference column 216 including reference cells 110'/130' and switches 222, 224, 226, and 228 that are preferably transistors. The magnetic storage cells 110/130 and 110'/130' are programmed and written as described above for the magnetic memories 100 and 120.

The magnetic memory 200 is divided into rows and columns. Typically, the I/O block includes eight, sixteen, sixty-four or another, generally larger number of columns. The spare column(s) 220 are used to account for malfunctions of cells in the remaining columns of the magnetic memory 200. During wafer level memory die testing, the magnetic memory 200 may be tested. For example, varying writing pulse magnitudes in conjunction with a reading operation may be used to determine the magnetic storage cells 110/130 that get written below a pre-determined minimum write current level, and cells 110/130 that do not write even with a pre-determined maximum writing current level. These storage cells are considered writing outliers. The columns that contain these outlier bits can then be substituted with good spare columns 220 by activating latch switches in bit line selectors. In this manner, the wafer yield can be enhanced.

The spare column(s) 220 may also be used for error checking. In addition to using the memory 200 to compensate for known bad bits, as described above, the extra columns 220 might be used for storing checker bits in an error code correction scheme. The error code might be used to overcome occasional errors in the magnetic memory 200. Occasional errors may occur for a number of reasons, such as thermally assisted switching, described previously. For designs having reading and writing currents that are high enough that a reading current disturb event might happen during the practical life of the memory device, the particular number of spare columns 220 desired can be determined. For an eight-bit memory, the number of extra columns needed for every eight columns is three because there are 2 to the $3^{rd}$ power of combinations of states between "0" and "1". For a sixteen-bit memory, the number of extra columns needed for every sixteen columns is four because there are 2 to the $4^{th}$ power of combinations of states between "0" and "1". For a sixty-four bit memory, the number of extra columns needed for every sixty-four columns is six because there are 2 to the $6^{th}$ power of combinations of states between "0" and "1". Adding error correction does increase the chip size, and slows down memory speed, but it may be necessary to produce a robust and reliable spin RAM chip.

Figure 11:
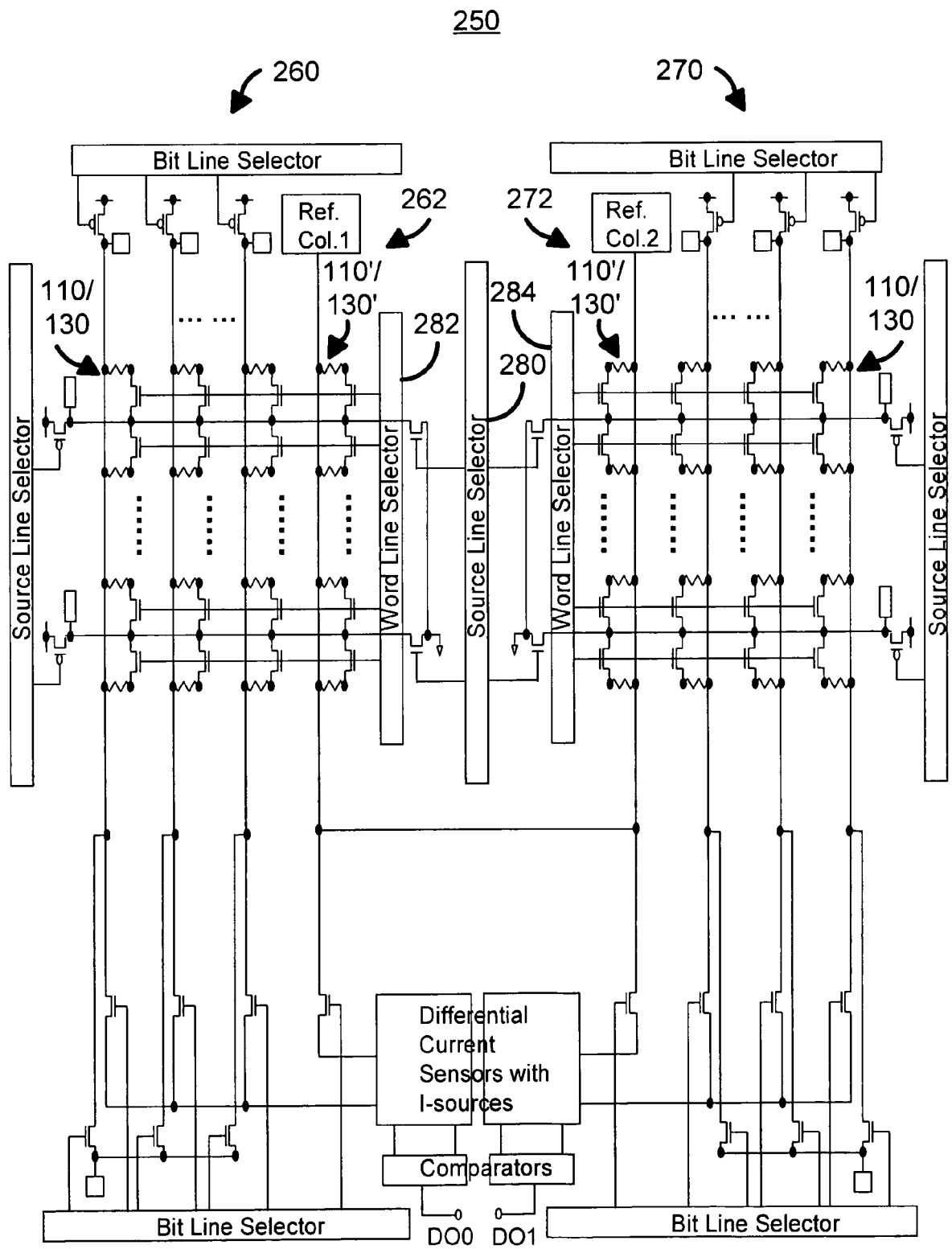
FIG. 11 is a diagram of a portion of one embodiment of a magnetic memory array and circuit in accordance with the present invention utilizing spin transfer switching with averaged mid-point reference reading signal and enhanced reading and writing margin.

FIG. 11 is a diagram of a portion of one embodiment of a magnetic memory 250 and circuit in accordance with the present invention utilizing spin transfer switching with averaged mid-point reference reading signal and enhanced reading and writing margin. The magnetic memory 250 contains two IO blocks 260 and 270 next to each other in a mirror image fashion and sharing a common source line selector 280. In addition, word line selectors 282 and 284, reference columns 262 and 272 are also shown. The blocks 260 and 270 may be analogous to the blocks 160 and 200 of FIGS. 9 and 10, respectively. Thus, the magnetic storage cells 110 and/or 130 and the method 150 may be used for the magnetic memory 250. Although two word line selectors 282 and 284 are shown, one word line selector (not shown) for both IO blocks 260 and 270 might be used. The magnetic elements 110'/130' for the reference columns 262 and 272 are preferably the same as the magnetic elements 110 and 130 described previously. In addition, the magnetic memory 250 is operated using the method 150.

As discussed above, the reference cells 110'/130' are programmed and read using currents driven through the reference cells 110'/130'. In one embodiment, magnetic elements 110'/130' of one of the reference columns 262 or 272 may be all set at the minimum resistance state, while magnetic elements 110'/130' in the other reference column 272 or 262, respectively, may all be set at the maximum resistance state. Because two reference columns 262 and 272 are used, the differential current sensors 286 and 288 sense the average current of reference magnetic elements from both reference columns 262 and 272 activated by a word line and a source line. Because the reference magnetic elements 110'/130' share the same enhanced current margin of the magnetic memories 100, 120, 160, and 200, and use the reference scheme described above, the magnetic cells 110'/130' provides an average current value required for reading. The reference columns 292 and 272 together provide reference signals to both magnetic elements 110/130 to their left and to their right.

Thus, magnetic memories 100, 120, 160, 200, and 250 and the method 150 may be written using a more localize phenomenon that avoids inadvertent writing during programming. Furthermore, the magnetic memories 100, 120, 160, 200, and 250 and the method 150 may have an enhanced, larger read and write margin. Consequently, inadvertent writing during reading may also be reduced. Consequently, performance of the magnetic memories 100, 120, 160, 200, and 250 may be improved.

A method and system for providing and using a magnetic memory having an improved read and write margins has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
   a plurality of magnetic storage cells, each of the plurality of magnetic storage cells including a magnetic element that is configured to be programmed to a high resistance state by a first write current driven through the magnetic element in a first direction and to a low resistance state by a second write current driven through the magnetic element in a second direction, the first write current and the second write current programming the magnetic element via spin transfer;
   at least one bit line corresponding to the plurality of magnetic storage cells; and
   a plurality of source lines corresponding to the plurality of magnetic storage cells;
   wherein the at least one bit line and the plurality of source lines are configured to drive the first write current through the magnetic element in the first direction, to drive the second write current through the magnetic element in the second direction, and to drive at least one read current through the magnetic element in a third direction that does not destabilize the low resistance state;
   wherein the second direction is opposite to the first direction and the second direction and the third direction are the same.

2. The magnetic memory of claim 1 further comprising:
   a plurality of word lines, each of the plurality of word lines corresponding to a magnetic storage cell of the plurality of magnetic storage cells and for allowing current to flow through the magnetic storage cell.

3. The magnetic memory of claim 2 wherein each of the plurality of magnetic storage cells further includes:
   at least one selection device, a portion of the plurality of word lines selectively activating the at least one selection device to allow current to flow through the magnetic element.

4. The magnetic memory of claim 3 wherein the at least one selection device is an selection transistor having a source, a drain, and a gate and wherein the portion of the plurality of word lines is a word line coupled with the gate of the selection transistor, the magnetic element being coupled with the drain and one of the plurality of source lines being coupled with the source.

5. The magnetic memory of claim 1 wherein each of the plurality of source lines corresponds to a pair of the plurality of magnetic storage cells.

6. The magnetic memory of claim 1 wherein the magnetic element includes a pinned layer having a first magnetization pinned in a pinned direction, a spacer layer, and a free layer having a second magnetization, the spacer layer residing between the pinned layer and the free layer, the free layer being configured such that the magnetic element is programmed to the high resistance state by the first write current driven through the magnetic element in the first direction and being programmed into the low resistance state by the second write current driven through the magnetic element in a second direction opposite to the first direction.

7. The magnetic element of claim 6 wherein the spacer layer is a barrier layer.

8. The magnetic element of claim 6 wherein the spacer layer is conductive.

9. The magnetic memory of claim 6 wherein the magnetic element further includes an additional spacer layer and an additional pinned layer, the free layer residing between the additional spacer layer and the spacer layer, the additional spacer layer residing between the free layer and the additional pinned layer.

10. The magnetic element of claim 9 wherein the spacer layer is a barrier layer.

11. The magnetic element of claim 10 wherein the additional spacer layer is an additional barrier layer.

12. The magnetic element of claim 10 wherein the additional spacer layer is conductive.

13. The magnetic element of claim 9 wherein the spacer layer is conductive.

14. The magnetic element of claim 13 wherein the additional spacer layer is an additional barrier layer.

15. The magnetic element of claim 13 wherein the additional spacer layer is conductive.

16. The magnetic memory of claim 1 further comprising:
at least one reference cell;
at least one additional bit line coupled with the at least one reference cell; and
at least one additional source line coupled with the at least one reference cell.

17. The magnetic memory of claim 1 further comprising:
at least one spare magnetic storage cell corresponding to the bit line, each of the at least one spare magnetic storage cell including a spare magnetic element capable of being programmed to a high resistance state by a first write current driven through the spare magnetic element in a first direction and being programmed into a low resistance state by a second write current driven through the spare magnetic element in a second direction opposite to the first direction;
at least one spare source line corresponding to the at least one spare magnetic storage cell;
wherein the at least one bit line and the at least one spare source line are configured to drive the first write current through the spare magnetic element in the first direction, to drive the second write current through the spare magnetic element in the second direction, and to drive at least one read current through the spare magnetic element in a third direction that does not destabilize the low resistance state.

18. The magnetic memory of claim 1 further comprising:
at least one spare magnetic storage cell coupled with at least a portion of the plurality of source lines, each of the at least one spare magnetic storage cell including a spare magnetic element capable of being programmed to a high resistance state by a first write current driven through the spare magnetic element in a first direction and being programmed into a low resistance state by a second write current driven through the spare magnetic element in a second direction opposite to the first direction;
at least one spare bit line corresponding to the at least one spare magnetic storage cell;
wherein the at least one spare bit line and the at least the plurality of source lines are configured to drive the first write current through the spare magnetic element in the first direction, to drive the second write current through the spare magnetic element in the second direction, and to drive the at least one read current through the spare magnetic element in the third direction.

19. The magnetic memory of claim 1 further comprising:
at least one error code correction.

20. A magnetic memory comprising:
a plurality of magnetic storage cells, each of the plurality of magnetic storage cells including a magnetic element and an selection device, the magnetic element being configured to be programmed to a high resistance state by a first write current driven through the magnetic element in a first direction and being programmed to a low resistance state by a second write current driven through the magnetic element in a second direction opposite to the first direction, the first write current and the second write current programming the magnetic element via spin transfer;
a plurality of bit lines, each of the plurality of bit lines corresponding to a first portion of the plurality of magnetic storage cells;
a plurality of source lines, each of the plurality of source lines corresponding to a second portion of the plurality of magnetic storage cells; and
a plurality of word lines, each of the plurality of word lines corresponding to a magnetic storage cell of the plurality of magnetic storage cells and for allowing current to flow through the magnetic storage cell;
wherein the plurality of bit lines and the plurality of source lines are configured to drive the first write current through the magnetic element in the first direction, to drive the second write current through the magnetic element in the second direction, and to drive at least one read current through the magnetic element in the second direction.

21. The magnetic memory of claim 20 further comprising:
a plurality of reference cells corresponding to at least a portion of the plurality of word lines and at least a portion of the plurality of source lines; and
at least one additional bit line coupled with the plurality of reference cells.

22. The magnetic memory of claim 20 further comprising:
a plurality of spare magnetic storage cells corresponding to the plurality of bit lines and the plurality of source lines, each of the plurality of spare magnetic storage cells including a spare magnetic element capable of being programmed to a high resistance state by a first write current driven through the spare magnetic element in a first direction and being programmed into a low resistance state by a second write current driven through the spare magnetic element in a second direction opposite to the first direction;
wherein the at least one spare bit line and the plurality of source lines are configured to drive the first write current through the spare magnetic element in the first direction, to drive the second write current through the spare magnetic element in the second direction, and to drive at least one read current through the spare magnetic element in a third direction that does not destabilize the low resistance state.

23. The magnetic memory of claim 20 further comprising:
a plurality of spare magnetic storage cells, each of the at least one spare magnetic storages cell including a spare magnetic element capable of being programmed to a high resistance state by a first write current driven through the spare magnetic element in a first direction and being programmed into a low resistance state by a second write current driven through the spare magnetic element in a second direction opposite to the first direction;
at least one spare bit line corresponding to the at least one spare magnetic storage cell;
at least one spare source line corresponding to the at least one spare magnetic storage cell;
wherein the at least one spare bit line and the at least one spare source line are configured to drive the first write current through the spare magnetic element in the first direction, to drive the second write current through the spare magnetic element in the second direction, and to drive at least one read current through the spare magnetic element in a third direction that does not destabilize the low resistance state.

24. A method for utilizing at least one magnetic memory cell in a memory, each of the at least one magnetic memory cell including a magnetic element capable of being programmed using spin transfer, the method comprising:
programming the at least one memory cell to a high resistance state or a low resistance state including programming the high resistance state by driving a first write current through the magnetic element in a first direction or programming the low resistance state by driving a second write current driven through the magnetic element in a second direction, the first write current and the second write current programming the magnetic element via spin transfer; and
reading the at least one magnetic memory cell by driving at least one read current through the magnetic element in a third direction that does not destabilize the low resistance states;
wherein the second direction and the third direction are the same.

25. The method of claim 24 wherein the second direction is opposite to the first direction.

26. The method of claim 24 wherein the programming includes driving the first write current and the second write current between at least one bit line and at least one source line.

27. The method of claim 24 wherein the reading includes driving the at least one read current between at least one bit line and at least one source line.

28. The method of claim 24 wherein at least one selection device corresponds to the at least one magnetic storage cell and wherein the programming further includes:
utilizing at least one word line to selectively activate the at least one selection device to allow the first write current or the second write current to flow through the at least one magnetic storage cell.

29. The method of claim 24 wherein at least one selection device corresponds to the at least one magnetic storage cell and wherein the reading further includes:
utilizing at least one word line to selectively activate the at least one selection device to allow the at least one read current to flow through the at least one magnetic storage cell.

30. The method of claim 24 wherein the magnetic element includes a pinned layer having a first magnetization pinned in a pinned direction, a spacer layer, and a free layer having a second magnetization, the spacer layer residing between the pinned layer and the free layer, the free layer being configured such that the magnetic element is programmed to the high resistance state by the first write current driven through the magnetic element in the first direction and being programmed into the low resistance state by the second write current driven through the magnetic element in a second direction opposite to the first direction.

31. The method of claim 30 wherein the spacer layer is a barrier layer.

32. The method of claim 30 wherein the spacer layer is conductive.

33. The method of claim 30 wherein the magnetic element further includes an additional spacer layer and an additional pinned layer, the free layer residing between the additional spacer layer and the spacer layer, the additional spacer layer residing between the free layer and the additional pinned layer.

34. The method of claim 33 wherein the spacer layer is a barrier layer.

35. The method of claim 34 wherein the additional spacer layer is an additional barrier layer.

36. The method of claim 34 wherein the additional spacer layer is conductive.

37. The method of claim 34 wherein the spacer layer is conductive.

38. The method of claim 37 wherein the additional spacer layer is an additional barrier layer.

39. The method of claim 37 wherein the additional spacer layer is conductive.

40. The method of claim 24 further comprising:
programming at least one reference cell; and
providing the at least one read current to the at least one reference cell.

* * * * *